(12) United States Patent
De Boer

(10) Patent No.: US 6,838,359 B2
(45) Date of Patent: Jan. 4, 2005

(54) SUPPRESSION OF N-TYPE AUTODOPING IN LOW-TEMPERATURE SI AND SIGE EPITAXY

(75) Inventor: Wiebe Barteld De Boer, Hopewell Junction, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/113,053

(22) Filed: Apr. 1, 2002

(65) Prior Publication Data

US 2002/0168791 A1 Nov. 14, 2002

(30) Foreign Application Priority Data

| Mar. 30, 2001 | (EP) | 01201235 |
| Mar. 30, 2001 | (EP) | 01201236 |
| Oct. 12, 2001 | (EP) | 01203900 |

(51) Int. Cl.[7] .............................................. H01L 21/20
(52) U.S. Cl. .................. 438/493; 438/907; 438/909; 438/916
(58) Field of Search ................. 438/493, 916, 438/913, 312–321, 47, 94, 907, 908, 933, 909, FOR 255, FOR 291, FOR 286, FOR 437, FOR 460, FOR 476, FOR 482, 235, 495, 935, FOR 225

(56) References Cited

U.S. PATENT DOCUMENTS

| 3,660,180 A | * | 5/1972 | Wajda ........................ 438/505 |
| 3,956,037 A | * | 5/1976 | Ishii et al. ................... 438/495 |
| 4,859,626 A | * | 8/1989 | Wise ........................... 438/505 |
| 4,894,349 A | * | 1/1990 | Saito et al. .................... 117/93 |
| 5,955,745 A | * | 9/1999 | Yamazaki ..................... 257/63 |
| 5,962,879 A | * | 10/1999 | Ryum et al. ................ 257/198 |
| 6,043,517 A | * | 3/2000 | Presting et al. ............. 257/184 |
| 6,313,017 B1 | * | 11/2001 | Varhue ....................... 438/503 |
| 6,316,795 B1 | * | 11/2001 | Croke, III ................... 257/197 |
| 6,346,452 B1 | * | 2/2002 | Kabir et al. ................ 438/312 |
| 2002/0042178 A1 | * | 4/2002 | Dutartre et al. ............. 438/234 |
| 2002/0060315 A1 | * | 5/2002 | Yokogawa et al. ............ 257/9 |
| 2003/0049894 A1 | * | 3/2003 | Berger et al. |

FOREIGN PATENT DOCUMENTS

| JP | 56023739 A | 3/1981 |
| JP | 02184019 A | 7/1990 |

OTHER PUBLICATIONS

Wolf S. "Silicon Processing for the VLSI–ERA: vol. 1–Process Technology", 1986, Lattice Pr., vol. 1, pp. 137–139, 145–146.*

U.S. Appl. No. 000819365, filed Apr. 2, 1982, New York, USA.

* cited by examiner

Primary Examiner—George Fourson
(74) Attorney, Agent, or Firm—Peter Zawilski

(57) ABSTRACT

A method of manufacturing a semiconductor device, which method comprises the step of epitaxially growing a stack comprising an n-type doped layer of a semiconductor material followed by at least one further layer of a semiconductor material, the stack being grown in one continuous cycle.

11 Claims, 5 Drawing Sheets

SUPPRESSION OF N-TYPE AUTODOPING IN LOW-TEMPERATURE SI AND SIGE EPITAXY

The present invention relates to a method of manufacturing a semiconductor device, as defined in the preamble of claim 1.

Such a method relates to the growth of doped epitaxial Si or $Si_{1-x}Ge_x$(SiGe) layers on monocrystalline Si layers by chemical vapour deposition (CVD). It is known that controlling the dopant concentration and dopant profile in such epitaxial layers may be a challenging task.

It is known in the art that during epitaxial growth of Si or SiGe in combination with doping at a low temperature, the incorporation of dopant continues after switching off the dopant supply. This process is generally known as the autodoping effect. Due to this effect in such an epitaxial growth process, the dopant profile obtained will differ from the desired profile. Typically, such an autodoping effect occurs due to (high-temperature) diffusion of a dopant from the underlying layer into the grown epitaxial layer, due to desorption of dopant species from the walls and the substrate holder of an epitaxy reactor vessel, and due to evaporation of dopant species from the front and back side of the substrate.

Obviously, autodoping may thus alter the dopant concentration in the epitaxial layer in a rather unpredictable manner.

Conventionally, the wafer is exposed to a high temperature (~1000° C. or higher) in a hydrogen-containing ambient to remove native oxide from the surface before the start of the epitaxial growth process. The high-temperature treatment, especially when performed at reduced pressure, also reduces the amount of dopant species adsorbed at the inner surfaces of the reactor chamber and at the wafer surface. This is a common way to reduce the autodoping. However, the high temperature may still be detrimental in micro-electronic device manufacturing since device feature sizes are small in comparison with the diffusion length of a dopant at such a high temperature.

From U.S. Pat. No. 3,669,769 a method is known to grow epitaxial layers on monocrystalline Si while minimizing the autodoping effect of the epitaxial layer. The method provides a very low initial growth rate of the epitaxial layer, which is increased after obtaining a certain minimum thickness of the layer. The temperature during such a process is between 800 and 1300° C.

U.S. Pat. No. 6,007,624 discloses a method of growing epitaxial Si layers wherein autodoping is controlled. In a low-temperature ultra high vacuum CVD process (at 500–850° C.), a thin capping layer of epitaxial silicon is grown. After formation of this capping layer, the temperature is increased and a further epitaxial layer is grown. Disadvantageously, due to the low process temperature during growth of the capping layer, the capping layer may not be fully epitaxial. Also, the method of U.S. Pat. No. 6,007,624 relates only to the specific preclusion of autodoping from buried layers.

JP-8-203831A discloses a method for growing, in a CVD epitaxy process, a single crystal layer consisting of two or more (sub)layers having different electronic properties. The method of JP-8-203831A relates to the epitaxial growth of Si at a high temperature (1080–1120° C.). Moreover, the method relates to relatively thick Si epitaxial layers (of at least 8 micrometer).

Disadvantageously, the methods from the prior art all relate to epitaxial layers having a thickness of at least one micron. Moreover, at some point in each of the methods from the prior art, the semiconductor material is exposed to a high temperature step, which may deteriorate a dopant profile in the semiconductor material by the relatively rapid diffusion at such a high temperature.

Furthermore, the formation of shallow layers (i.e., well below one micrometer) with well-defined and abrupt n-type dopant profiles does not appear feasible if use is made of these methods from the prior art.

It is an object of the present invention to provide a method of manufacturing a semiconductor device, as defined in the preamble of claim 1, in which the occurrence of n-type autodoping in epitaxial layers is strongly suppressed.

This object is achieved by the method of manufacturing a semiconductor device, as defined in the preamble of claim 1, wherein the stack is grown in one continuous growth cycle.

Advantageously, the omission of the purging cycles results in a single continuous growth cycle, and causes the n-type autodoping effect to be suppressed. The growth method according to the present invention results in better defined limits and shapes of dopant profiles in epitaxial layers. Moreover, the method enables the growth of thin doped epitaxial layers (spikes).

Below, the invention will be explained with reference to some drawings, which are intended for illustration purposes only and not to limit the scope of protection as defined in the accompanying claims.

Figure 5:
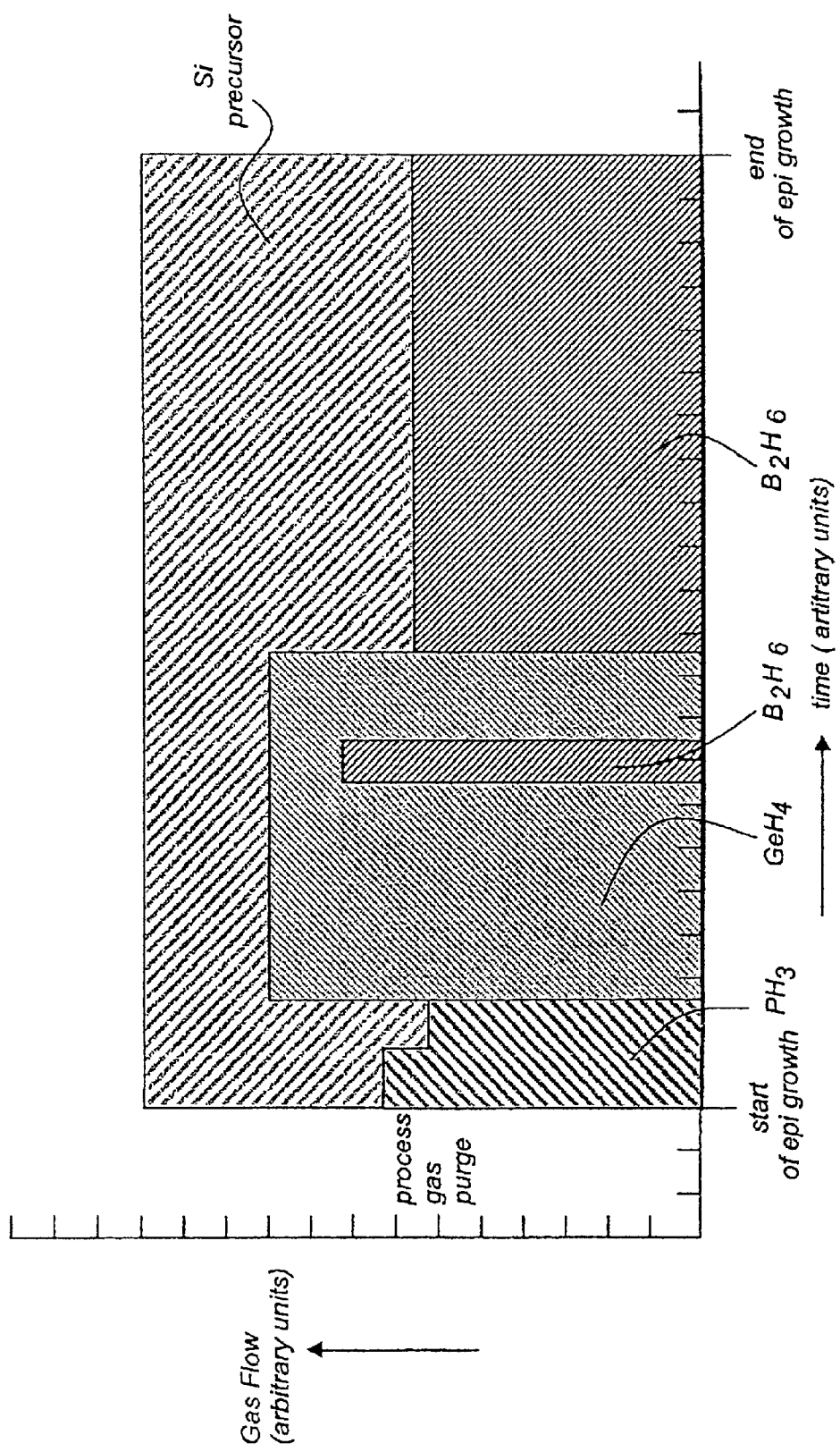

FIG. 5 schematically illustrates the switching of the respective gas flows during a growth process according to the present invention.

Hereinbelow, the growth method according to the present invention will be explained by means of some experiments which illustrate the growth of n-type doped epitaxial Si or SiGe layers. The dopant profiles resulting from these experiments are measured by Secondary Ion Mass Spectroscopy. The analysis of these results will clearly show the improvement obtained by growing such doped epitaxial Si or SiGe layers by means of a method in accordance with the present invention.

Figure 1:
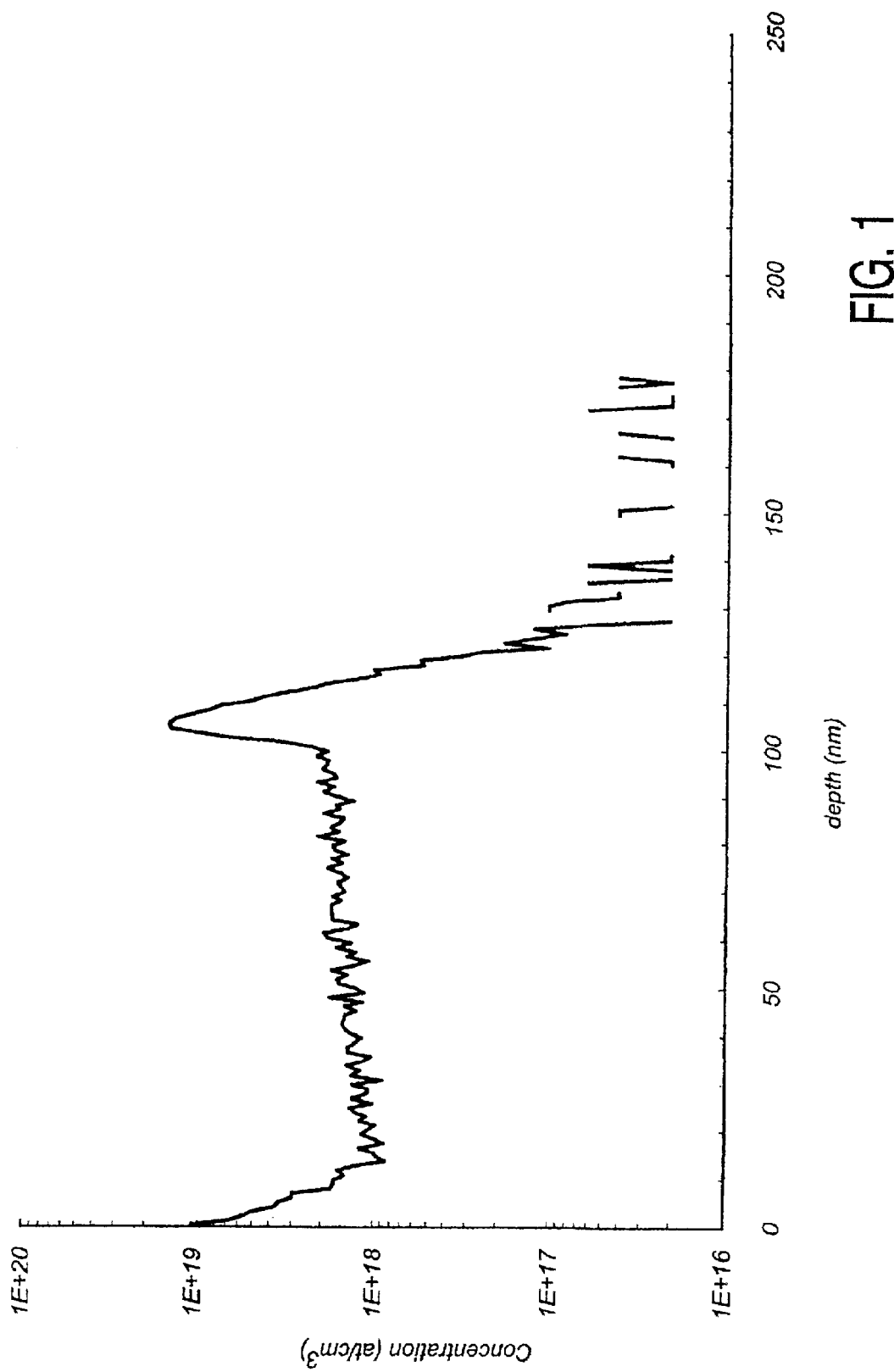
FIG. 1 shows a Secondary Ion Mass Spectroscopy (SIMS) plot of a P-doped epitaxial Si layer (P spike) with an Si capping layer, produced by a growing method from the prior art using an $SiH_4$ flow.

FIG. 1 shows an SIMS plot of a P-doped epitaxial Si layer (P spike) with an Si capping layer, produced by a growing method from the prior art using an $SiH_4$ flow (with $H_2$ as the carrier gas).

The SIMS plot shows the profile of phosphorus (P) as a function of sputtering depth in the sample. The P spike is grown by exposing an Si surface to $PH_3$ vapour without the Si precursor $SiH_4$. After a while the $PH_3$ source is switched off and the epitaxial growth continues or starts.

The autodoping effect is clearly observed. The P spike is located at a depth of ~100 nm. In the P signal a long autodoping tail is shown between ~100 nm and ~25 nm: the P concentration does not drop to the SIMS detection limit at the surface side of the P peak. Nevertheless, the P spike may be useable as it is about one order of magnitude higher than the autodoping tail.

Figure 2:
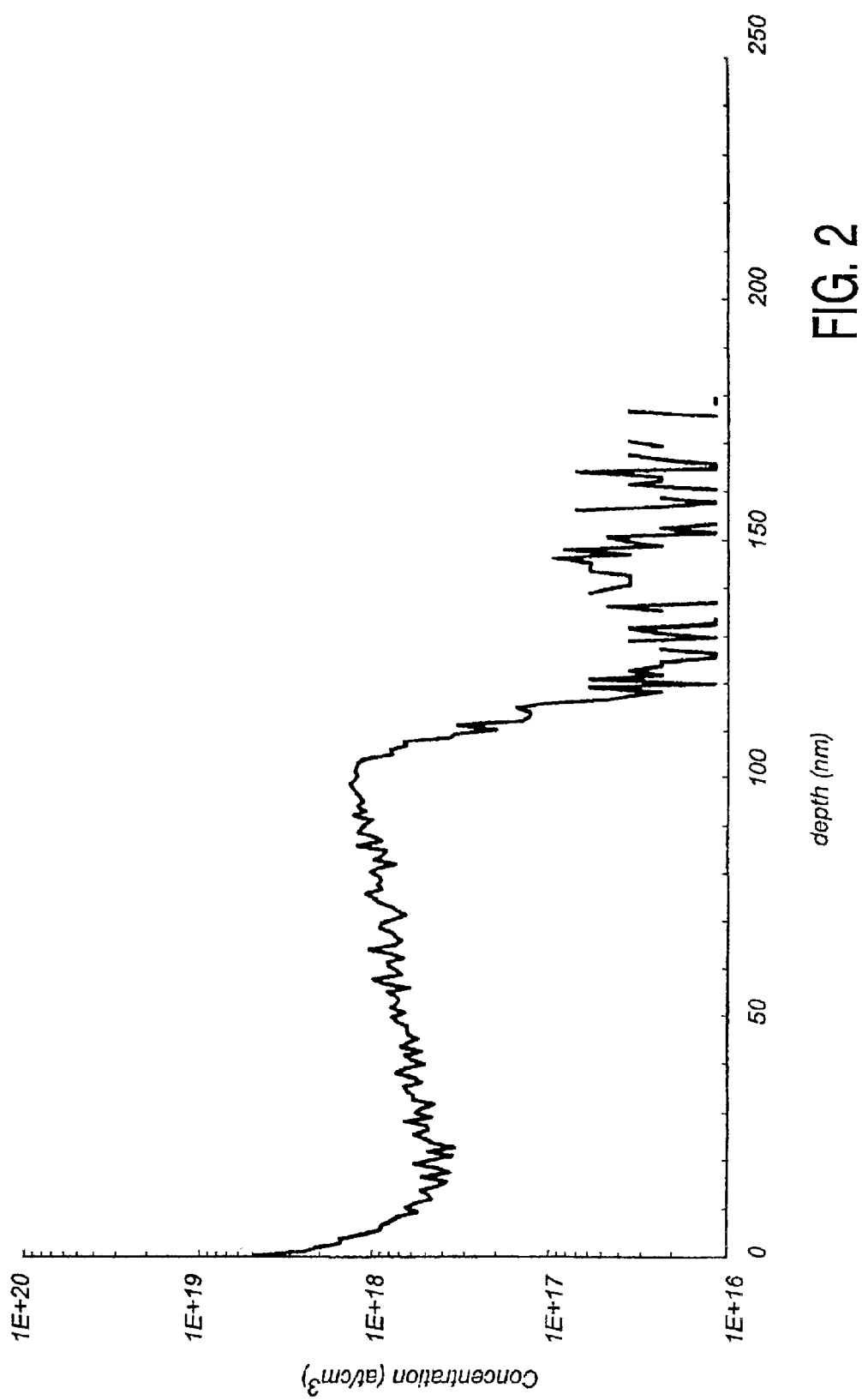
FIG. 2 shows an SIMS plot of a P-spike with an Si capping layer, produced by a growing method from the prior art using an $SiH_2Cl_2$ flow.

FIG. 2 shows a SIMS plot of a P-spike with an Si capping layer, produced by a growing method from the prior art using an $SiH_2Cl_2$ flow. The SIMS plot shows the profile of phosphorus (P) as a function of sputtering depth in the sample.

To grow such a P spike, an experiment similar to that described above was carried out by means of a process in which dichlorosilane ($SiH_2Cl_2$) replaces $SiH_4$ as the Si precursor. In FIG. 2 a typical example is shown of an attempt to grow a P spike with a capping layer grown from $SiH_2Cl_2$.

In contrast to the dopant profile of FIG. 1 that is grown using $SiH_4$ as the Si precursor, there is no spike in this case, just an autodoping tail. The difference between the two profiles is most probably caused by the presence of Cl in $SiH_2Cl_2$.

When one tries to use a dopant profile similar to that shown in FIG. 1, for example in the collector of a heterojunction bipolar transistor (HBT), P spikes pop up at every interface (Si/SiGe, SiGe/SiGe[B], SiGe/Si), which destroy the target profile.

During the growth interruptions used to stabilize the gas flows when the layer composition is changed, P is still being delivered to the surface of the wafer and accumulates.

Figure 3:
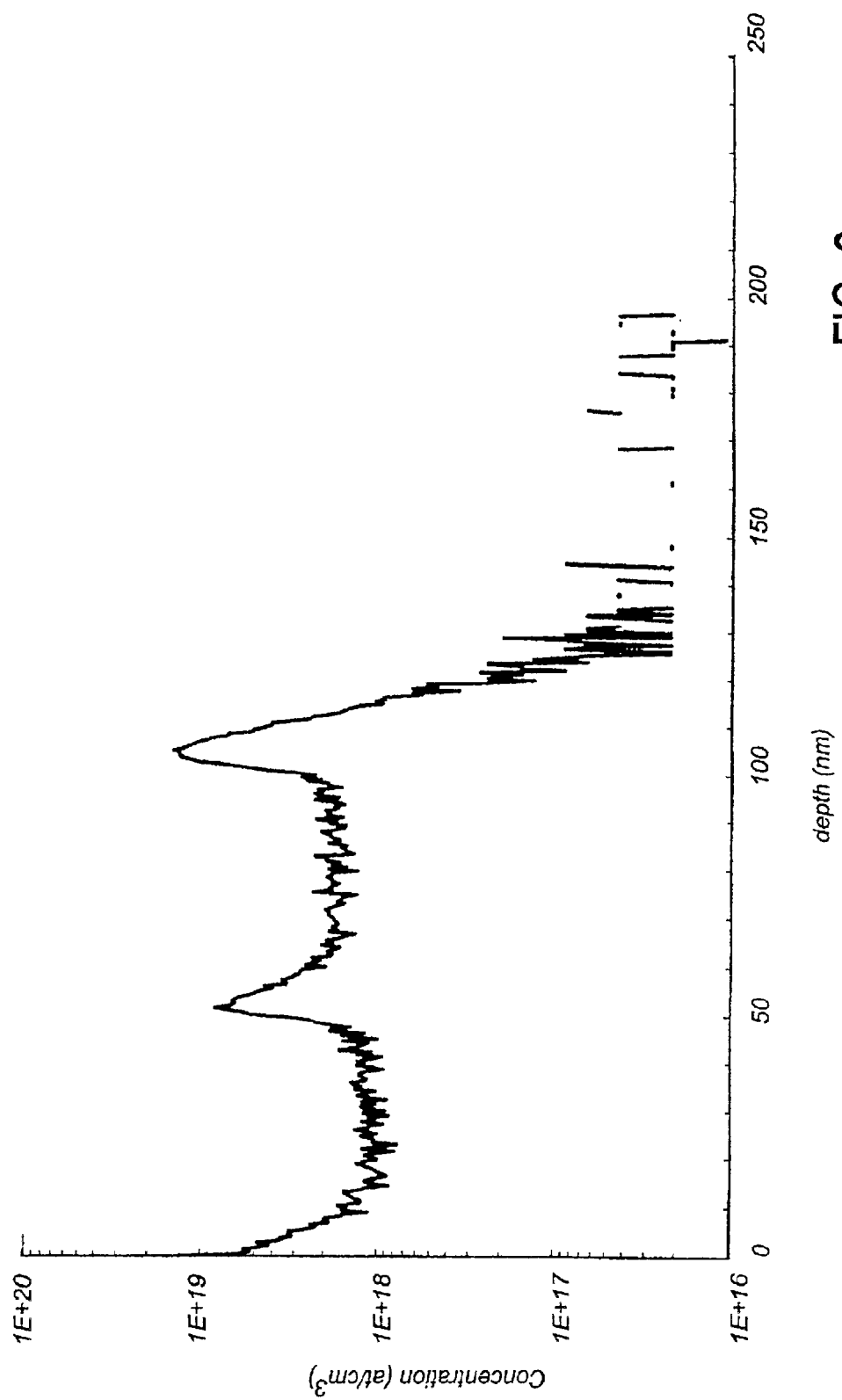
FIG. 3 shows an SIMS plot of a P-spike with an Si capping layer, produced by a growing method from the prior art using an interruption in the $SiH_4$ flow.

FIG. 3 shows a SIMS plot of a P-spike with an Si capping layer, produced by a growing method from the prior art using an interruption in the $SiH_4$ flow.

The SIMS plot shows the profile of phosphorus (P) as a function of sputtering depth in the sample.

From the plot it can be derived that the epitaxial layer was grown in the same way as the one obtained in FIG. 1, except for the fact that the growth of the capping layer was interrupted halfway the layer for one minute and then continued.

As is known to persons skilled in the art, the growth of a complicated epitaxial multilayer, like a HBT structure, is characterized by several growth interruptions. Such interruptions occur e.g., when switching from Si to SiGe and back or from undoped to doped layers take place.

The accumulation of n-type dopant is especially harmful at the Si/SiGe transition and precludes the use of in-situ n-type dopant at low temperatures and reduced pressure.

In spite of its long autodoping tail, a P profile as shown in FIG. 1 can still be used, e.g. for in-situ doping the collector part of a HBT structure. This can be done by adapting the growing process in such a way that secondary P spikes are avoided.

The method of growing semiconductor epitaxial layers according to the present invention recognizes the importance of these interruptions in the growth process. It has been found that if the growth is not interrupted, the dopant element P does not accumulate at the layer transitions and secondary P spikes are suppressed.

This means in practice that the flow stabilization phase(s) during the growth process is (are) skipped, leading to gas flow transients when the layer composition is changed. The resulting increased transition widths usually do not deteriorate the transistor performance.

It is noted that by using the method of the present invention, the combination of $AsH_3$ and $SiH_4$ enables the growth of As spikes and results in similar As profiles as the ones shown in FIGS. 1, 2 and 3 for P spikes.

The problem of the occurrence of n-type doped spikes at every interface during low-temperature reduced-pressure epitaxy of n-type doped Si and SiGe layers can be circumvented by not interrupting the growing process when the layer composition is changed. The resulting deterioration of transition widths between layers is usually not harmful. Among others this growing method is found to be beneficial in growing the collector part of an HBT structure with an in-situ n-type doping step.

Figure 4:
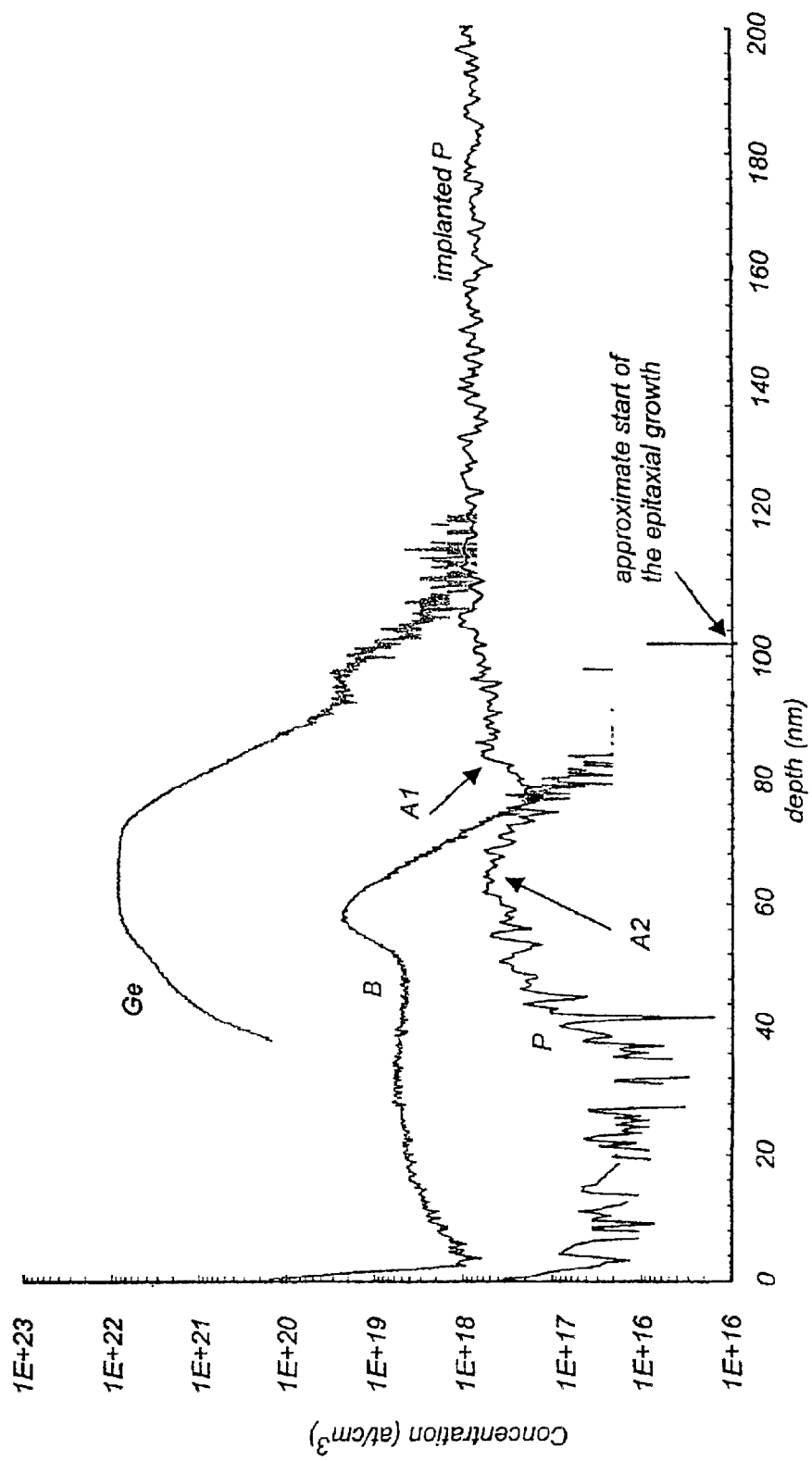
FIG. 4 shows a SIMS plot of the distribution of dopants in an epitaxial Si—SiGe—Si multilayer, produced by a growing method according to the present invention.

FIG. 4 shows a SIMS plot of the distribution of dopants in a typical epitaxial Si[P]/SiGe/SiGe[B]/SiGe/Si[B] multilayer, produced by a growing method according to the present invention.

The SIMS plot shows the profiles of phosphorus (P), Germanium (Ge), and Boron (B) as a function of sputtering depth in the sample. Each profile is indicated by its chemical symbol.

The multilayer is composed as follows. A phosphorus-doped Si[P] layer is grown on a semiconductor surface that is used as the first layer. On top of this Si[P] layer, a first intrinsic epitaxial SiGe layer is grown. On top of the intrinsic SiGe layer, a boron-doped epitaxial SiGe[B] layer is deposited. Next, a second intrinsic SiGe layer is grown. Finally an epitaxial doped Si[B] top layer is deposited.

The multilayer is grown in a low-temperature and reduced-pressure process (e.g., at 700° C., $2.66 \times 10^3$ Pa), using gas flows and a flow switching scheme which will be explained below with reference to FIG. 5.

In FIG. 4, it is important to note the distribution of phosphorus between roughly 50 and 100 nm. Unlike the profile grown by means of the method from the prior art, no major P peaks are present, which disturb the functioning of the device. After the $PH_3$ flow has been switched off, the P level drops. Switching off the $PH_3$ flow is indicated by means of arrow A1.

Some segregation still occurs: the release of $B_2H_6$, indicated by means of arrow A2, in the growing ambient causes an increase of the P signal (at a depth of ~68 nm). However, the P level remains low enough and does not adversely affect the HBT structure.

It is also found that the new growing method slightly deteriorates the Ge profile (in the SiGe/SiGe[B]/SiGe layer). The leading and trailing slopes of the SiGe/SiGe[B]/SiGe layer are not as steep as they may be when gas flow interruptions are used during growth. It is noted that the reduced steepness of the slopes does not relate to a fundamental problem but to certain imperfections in the hardware of the epitaxial reactor.

FIG. 5 schematically illustrates the growing process with respect to the way the reactants (process gases) are switched on and off. The Y-axis indicates the magnitude of the flow, the X-axis the duration. On both axes arbitrary units are used. It is noted that no indication is given of the actual ratio of the respective processing times and layer thicknesses. Also, the relative height of the individual flows does not indicate the ratio of the respective flows. Each gas flow is indicated as a hatched area and marked by the chemical formula of the respective gas.

At the start of the growth process, a gas flow of an Si precursor (e.g., $SiH_4$) is opened. Simultaneously, a gas flow of $PH_3$ is opened. After some time, the $PH_3$ flow is slightly reduced. After the growth of the Si[P] layer is completed the $PH_3$ gas flow is stopped.

Simultaneously, the $GeH_4$ gas flow is opened to start the growth of the SiGe layer. After growing the first intrinsic SiGe layer, a gas flow of $B_2H_6$ is opened to dope the SiGe layer with boron to form the doped SiGe[B] layer.

After completion of the doped SiGe[B] layer, the $B_2H_6$ gas flow is stopped. With the Si precursor gas flow and the $GeH_4$ gas flow still open, the second intrinsic SiGe layer is grown.

Finally, the GeH$_4$ gas flow is stopped, and the B$_2$H$_6$ gas flow is opened to grow the top boron-doped Si[B] layer.

After completion of the epitaxial Si[P]/SiGe/SiGe[B]/SiGe/Si[B] multilayer, the Si precursor gas flow and the B$_2$H$_6$ gas flow are stopped. The process cycle ends with a finishing cycle, as known in the art, to purge the process chamber, and to cool down the semiconductor wafer on which the multilayer has been deposited.

It is noted that no purging cycles are applied between the growth of the individual layers in the Si[P]/SiGe/SiGe[B]/SiGe/Si[B] multilayer. Omitting the purging cycles, not using the interrupted growth cycle according to a method of the prior art, and growing the entire epitaxial layer in one continuous growth cycle, gives rise to the improvements in the dopant profile depicted in the SIMS plot of FIG. 4.

Furthermore, it is noted that the method of the present invention may also be used in the manufacture of doped silicon-germanium-carbon alloy (SiGe:C) layers to suppress the n-type autodoping in such SiGe:C layers.

What is claimed is:

1. A method of manufacturing a semiconductor device comprising the steps of:

epitaxially growing a stack comprising an n-type doped layer of a semiconductor material without first exposing the semiconductor material to a high temperature step of approximately 1000° C. while subjecting the layer simultaneously to a gas flow of an Si precursor and n-type dopant gas for which at least one of a phosphorus-containing compound and an arsenic-containing compound is applied;

simultaneously stopping flow of the n-type dopant gas and commencing the flow of GeH$_4$ gas;

growing a first SiGe layer;

after completing the first SiGe layer, commencing a flow of B$_2$H$_6$ to form the p-type doped layer; and after completion of the p-type doped layer, simultaneously stopping the B$_2$H$_6$ gas flow and commencing growth of a further layer of semiconductor material, the stack further comprising said further layer and being grown in one continuous growth cycle without any purging cycles.

2. A method as claimed in claim 1, wherein the growth process is performed at sub-atmospheric pressure.

3. A method as claimed in claim 2, wherein the growth process is performed at a sub-atmospheric pressure in the range between about 665 and 13300 Pa.

4. A method as claimed in claim 1, wherein either silicon or a silicon-germanium alloy or a silicon-germanium-carbon alloy is applied as the semiconductor material of the n-type doped layer.

5. A method as claimed in claim 1, wherein either silicon or a silicon-germanium alloy or a silicon-germanium-carbon alloy is applied as the semiconductor material of the at least one further layer.

6. A method as claimed in claim 1, wherein phosphine (PH$_3$) is applied as the phosphorus-containing compound.

7. A method as claimed in claim 1, wherein arsine (AH$_3$) is applied as the arsenic-containing compound.

8. A method as claimed in claim 1, wherein the growth process is performed at a temperature below about 800° C.

9. A method of manufacturing a semiconductor device, which method comprises the step of epitaxially growing a stack comprising an n-typed doped layer of a semiconductor material followed by at least one further layer of a semiconductor material, the stack being grown in one continuous cycle at a low temperature of 700° C. without first healing a wafer to a high temperature of approximately 1000° C. prior to the step of epitaxially growing the stack, and wherein said epitaxial stack is not a capping layer.

10. A method as claimed in claim 1, wherein the semiconductor device comprises a heterojunction bipolar transistor.

11. The method of claim 1, wherein flow of the n-type dopant gas is reduced for a period of time before it is stopped.

* * * * *